(12) United States Patent
Layman et al.

(10) Patent No.: US 8,803,025 B2
(45) Date of Patent: Aug. 12, 2014

(54) NON-PLUGGING D.C. PLASMA GUN

(75) Inventors: Frederick P. Layman, Carefree, AZ (US); David Leamon, Gilbert, AZ (US)

(73) Assignee: SDCmaterials, Inc., Tempe, AZ (US)

( * ) Notice: Subject to any disclaimer, the term of this patent is extended or adjusted under 35 U.S.C. 154(b) by 541 days.

(21) Appl. No.: 12/965,735

(22) Filed: Dec. 10, 2010

(65) Prior Publication Data

US 2011/0143041 A1 Jun. 16, 2011

Related U.S. Application Data

(60) Provisional application No. 61/284,329, filed on Dec. 15, 2009.

(51) Int. Cl.
*B23K 9/00* (2006.01)

(52) U.S. Cl.
USPC ............ 219/121.36; 219/76.16; 219/121.47; 219/121.5; 427/446; 427/447; 427/448; 427/455; 427/456

(58) Field of Classification Search
CPC ............ C23C 4/127; C23C 4/00; C23C 4/12; B01J 37/349; B01J 23/42; B01J 35/0013; B82Y 30/00; B82Y 40/00; Y02T 10/22
USPC .......... 118/723 R, 723 CB, 723 EB, 723 MP; 219/76.16, 121.36, 121.47, 121.5; 427/446–456; 502/5, 300, 339
See application file for complete search history.

(56) References Cited

U.S. PATENT DOCUMENTS

| | | | |
|---|---|---|---|
| 2,284,554 A | 5/1942 | Beyerstedt | |
| 2,419,042 A | 4/1947 | Todd | 202/205 |
| 2,519,531 A | 8/1950 | Worn | 230/95 |
| 2,562,753 A | 7/1951 | Trost | 241/39 |
| 2,689,780 A | 9/1954 | Rice | 23/106 |
| 3,001,402 A | 9/1961 | Koblin | 73/421.5 |
| 3,042,511 A | 7/1962 | Reding, Jr. | |

(Continued)

FOREIGN PATENT DOCUMENTS

| | | |
|---|---|---|
| EP | 1 134 302 A1 | 9/2001 |
| EP | 1 619 168 A1 | 1/2006 |

(Continued)

OTHER PUBLICATIONS

A. Gutsch et al., "Gas-Phase Production of Nanoparticles", Kona No. 20, 2002, pp. 24-37.

(Continued)

*Primary Examiner* — Dana Ross
*Assistant Examiner* — Brett Spurlock
(74) *Attorney, Agent, or Firm* — Morrison & Foerster LLP

(57) ABSTRACT

A plasma gun system comprising: a plasma gun comprising an outlet, wherein the plasma gun is configured to generate a plasma stream and provide the plasma stream to the outlet; and a plasma gun extension assembly configured to be coupled to the plasma gun, wherein the plasma gun extension assembly comprises an extension chamber and a port, the extension chamber having an interior diameter defined by a chamber wall and being configured to receive the plasma stream from the outlet of the plasma gun and to enable the plasma stream to expand upon entering the extension chamber, and the port being configured to introduce a powder to the expanded plasma stream at a location outside of the plasma gun.

18 Claims, 2 Drawing Sheets

(56) References Cited

U.S. PATENT DOCUMENTS

| | | | | |
|---|---|---|---|---|
| 3,067,025 A | 12/1962 | Chisholm | | 75/84.5 |
| 3,145,287 A | 8/1964 | Siebein et al. | | |
| 3,178,121 A | 4/1965 | Wallace, Jr. | | 241/5 |
| 3,179,782 A | 4/1965 | Matvay | | |
| 3,181,947 A | 5/1965 | Vordahl | | |
| 3,235,700 A * | 2/1966 | Mondain-Monval et al. | | 219/76.16 |
| 3,313,908 A | 4/1967 | Unger et al. | | |
| 3,401,465 A | 9/1968 | Larwill | | 34/57 |
| 3,450,926 A | 6/1969 | Kiernan | | |
| 3,457,788 A | 7/1969 | Miyajima | | 73/422 |
| 3,537,513 A | 11/1970 | Austin | | 165/70 |
| 3,552,653 A * | 1/1971 | Inoue | | 239/81 |
| 3,617,358 A * | 11/1971 | Dittrich | | 427/447 |
| 3,667,111 A * | 6/1972 | Chartet | | 228/224 |
| 3,741,001 A | 6/1973 | Fletcher et al. | | 73/28 |
| 3,752,172 A | 8/1973 | Cohen et al. | | 137/12 |
| 3,761,360 A | 9/1973 | Auvil et al. | | |
| 3,774,442 A | 11/1973 | Gustavsson | | 73/28 |
| 3,804,034 A | 4/1974 | Stiglich, Jr. | | |
| 3,830,756 A | 8/1974 | Sanchez et al. | | |
| 3,871,448 A | 3/1975 | Vann et al. | | |
| 3,892,882 A | 7/1975 | Guest et al. | | 427/34 |
| 3,914,573 A | 10/1975 | Muehlberger | | 219/76 |
| 3,959,094 A | 5/1976 | Steinberg | | |
| 3,959,420 A | 5/1976 | Geddes et al. | | 261/112 |
| 3,969,482 A | 7/1976 | Teller | | |
| 4,008,620 A | 2/1977 | Narato et al. | | 73/421.5 A |
| 4,018,388 A | 4/1977 | Andrews | | 241/39 |
| 4,021,021 A | 5/1977 | Hall et al. | | |
| 4,127,760 A | 11/1978 | Meyer et al. | | |
| 4,139,497 A | 2/1979 | Castor et al. | | 252/470 |
| 4,146,654 A * | 3/1979 | Guyonnet | | 427/451 |
| 4,157,316 A | 6/1979 | Thompson et al. | | |
| 4,171,288 A | 10/1979 | Keith et al. | | 252/462 |
| 4,174,298 A | 11/1979 | Antos | | |
| 4,189,925 A | 2/1980 | Long | | |
| 4,227,928 A | 10/1980 | Wang | | |
| 4,248,387 A | 2/1981 | Andrews | | 241/5 |
| 4,253,917 A | 3/1981 | Wang | | |
| 4,260,649 A | 4/1981 | Dension et al. | | |
| 4,284,609 A | 8/1981 | deVries | | 423/242 |
| 4,315,874 A | 2/1982 | Ushida et al. | | |
| 4,344,779 A | 8/1982 | Isserlis | | |
| 4,369,167 A | 1/1983 | Weir | | |
| 4,388,274 A | 6/1983 | Rourke et al. | | 422/177 |
| 4,419,331 A | 12/1983 | Montalvo | | |
| 4,431,750 A | 2/1984 | McGinnis et al. | | |
| 4,436,075 A | 3/1984 | Campbell et al. | | 123/557 |
| 4,440,733 A | 4/1984 | Lawson et al. | | |
| 4,458,138 A | 7/1984 | Adrian et al. | | |
| 4,459,327 A | 7/1984 | Wang | | |
| 4,505,945 A | 3/1985 | Dubust et al. | | |
| 4,513,149 A | 4/1985 | Gray et al. | | 564/449 |
| 4,523,981 A | 6/1985 | Ang et al. | | |
| 4,545,872 A | 10/1985 | Sammells et al. | | |
| RE32,244 E * | 9/1986 | Andersen | | 427/450 |
| 4,609,441 A | 9/1986 | Frese, Jr. et al. | | |
| 4,723,589 A * | 2/1988 | Iyer et al. | | 164/46 |
| 4,731,517 A | 3/1988 | Cheney | | |
| 4,751,021 A | 6/1988 | Mollon et al. | | |
| 4,764,283 A | 8/1988 | Ashbrook et al. | | 210/695 |
| 4,765,805 A | 8/1988 | Wahl et al. | | |
| 4,824,624 A | 4/1989 | Palicka et al. | | 264/67 |
| 4,836,084 A | 6/1989 | Vogelesang et al. | | |
| 4,855,505 A | 8/1989 | Koll | | 564/398 |
| 4,866,240 A | 9/1989 | Webber | | 219/121.47 |
| 4,877,937 A * | 10/1989 | Muller | | 219/121.59 |
| 4,885,038 A | 12/1989 | Anderson et al. | | |
| 4,921,586 A | 5/1990 | Molter | | |
| 4,970,364 A * | 11/1990 | Muller | | 427/451 |
| 4,983,555 A | 1/1991 | Roy et al. | | 501/120 |
| 4,987,033 A | 1/1991 | Abkowitz et al. | | 428/469 |
| 5,006,163 A | 4/1991 | Benn et al. | | |
| 5,015,863 A | 5/1991 | Takeshima et al. | | |
| 5,041,713 A | 8/1991 | Weidman | | 219/121.51 |
| 5,043,548 A | 8/1991 | Whitney et al. | | 219/121.84 |
| 5,070,064 A | 12/1991 | Hsu et al. | | |
| 5,073,193 A | 12/1991 | Chaklader et al. | | 75/346 |
| 5,133,190 A | 7/1992 | Abdelmalek | | |
| 5,151,296 A | 9/1992 | Tokunaga | | |
| 5,157,007 A | 10/1992 | Domesle et al. | | |
| 5,192,130 A | 3/1993 | Endo et al. | | |
| 5,230,844 A | 7/1993 | Macaire et al. | | |
| 5,233,153 A * | 8/1993 | Coats | | 219/121.47 |
| 5,269,848 A | 12/1993 | Nakagawa | | |
| 5,330,945 A | 7/1994 | Beckmeyer et al. | | |
| 5,338,716 A | 8/1994 | Triplett et al. | | |
| 5,369,241 A | 11/1994 | Taylor et al. | | 219/121.47 |
| 5,371,049 A | 12/1994 | Moffett et al. | | 501/89 |
| 5,372,629 A | 12/1994 | Anderson et al. | | 75/332 |
| 5,392,797 A | 2/1995 | Welch | | 134/108 |
| 5,436,080 A | 7/1995 | Inoue et al. | | |
| 5,439,865 A | 8/1995 | Abe et al. | | 502/333 |
| 5,442,153 A | 8/1995 | Marantz et al. | | 219/121.47 |
| 5,452,854 A * | 9/1995 | Keller | | 239/80 |
| 5,460,701 A | 10/1995 | Parker et al. | | |
| 5,464,458 A | 11/1995 | Yamamoto | | |
| 5,485,941 A | 1/1996 | Guyomard et al. | | 222/1 |
| 5,534,149 A | 7/1996 | Birkenbeil et al. | | 210/636 |
| 5,534,270 A | 7/1996 | De Castro | | |
| 5,543,173 A | 8/1996 | Horn, Jr. et al. | | |
| 5,553,507 A | 9/1996 | Basch et al. | | 73/863.01 |
| 5,562,966 A | 10/1996 | Clarke et al. | | |
| 5,582,807 A | 12/1996 | Liao et al. | | |
| 5,611,896 A | 3/1997 | Swanepoel et al. | | 204/169 |
| 5,630,322 A | 5/1997 | Heilmann et al. | | 62/95 |
| 5,652,304 A | 7/1997 | Calderon et al. | | |
| 5,714,644 A | 2/1998 | Irgang et al. | | |
| 5,723,187 A * | 3/1998 | Popoola et al. | | 427/453 |
| 5,726,414 A | 3/1998 | Kitahashi et al. | | |
| 5,733,662 A * | 3/1998 | Bogachek | | 427/446 |
| 5,749,938 A | 5/1998 | Coombs | | 75/332 |
| 5,776,359 A | 7/1998 | Schultz et al. | | 252/62.51 |
| 5,788,738 A | 8/1998 | Pirzada et al. | | 75/331 |
| 5,804,155 A | 9/1998 | Farrauto et al. | | |
| 5,811,187 A | 9/1998 | Anderson et al. | | 428/403 |
| 5,837,959 A | 11/1998 | Muehlberger et al. | | 219/121.47 |
| 5,851,507 A | 12/1998 | Pirzada et al. | | 423/659 |
| 5,853,815 A | 12/1998 | Muehlberger | | 427/446 |
| 5,858,470 A * | 1/1999 | Bernecki et al. | | 427/453 |
| 5,884,473 A | 3/1999 | Noda et al. | | |
| 5,905,000 A | 5/1999 | Yadav et al. | | 429/33 |
| 5,928,806 A | 7/1999 | Olah et al. | | |
| 5,935,293 A | 8/1999 | Detering et al. | | 75/10.29 |
| 5,973,289 A * | 10/1999 | Read et al. | | 219/121.48 |
| 5,989,648 A | 11/1999 | Phillips | | 427/456 |
| 5,993,967 A | 11/1999 | Brotzman, Jr. et al. | | 428/407 |
| 5,993,988 A | 11/1999 | Ohara et al. | | 429/40 |
| 6,004,620 A * | 12/1999 | Camm | | 427/142 |
| 6,012,647 A | 1/2000 | Ruta et al. | | 239/132.1 |
| 6,033,781 A | 3/2000 | Brotzman, Jr. et al. | | 428/405 |
| 6,045,765 A | 4/2000 | Nakatsuji et al. | | |
| 6,059,853 A | 5/2000 | Coombs | | 75/332 |
| 6,066,587 A | 5/2000 | Kurokawa et al. | | |
| 6,084,197 A * | 7/2000 | Fusaro, Jr. | | 219/121.47 |
| 6,093,306 A | 7/2000 | Hanrahan et al. | | |
| 6,093,378 A | 7/2000 | Deeba et al. | | |
| 6,102,106 A | 8/2000 | Manning et al. | | 165/76 |
| 6,117,376 A | 9/2000 | Merkel | | |
| 6,168,694 B1 | 1/2001 | Huang et al. | | |
| 6,190,627 B1 | 2/2001 | Hoke et al. | | |
| 6,213,049 B1 * | 4/2001 | Yang | | 118/723 R |
| 6,214,195 B1 | 4/2001 | Yadav et al. | | 205/334 |
| 6,228,904 B1 | 5/2001 | Yadav et al. | | 523/210 |
| 6,254,940 B1 | 7/2001 | Pratsinis et al. | | 427/562 |
| 6,261,484 B1 | 7/2001 | Phillips et al. | | 264/5 |
| 6,267,864 B1 | 7/2001 | Yadav et al. | | 205/341 |
| 6,322,756 B1 | 11/2001 | Arno et al. | | |
| 6,342,465 B1 | 1/2002 | Klein et al. | | |
| 6,344,271 B1 | 2/2002 | Yadav et al. | | 428/402 |
| 6,362,449 B1 * | 3/2002 | Hadidi et al. | | 219/121.36 |
| 6,379,419 B1 | 4/2002 | Celik et al. | | 75/346 |
| 6,387,560 B1 | 5/2002 | Yadav et al. | | 429/45 |

(56) References Cited

U.S. PATENT DOCUMENTS

| | | | |
|---|---|---|---|
| 6,395,214 B1 | 5/2002 | Kear et al. | 264/434 |
| 6,398,843 B1 | 6/2002 | Tarrant | 75/249 |
| 6,409,851 B1 | 6/2002 | Sethuram et al. | 148/565 |
| 6,413,781 B1 | 7/2002 | Geis et al. | 436/178 |
| 6,416,818 B1 | 7/2002 | Aikens et al. | 427/383.1 |
| RE37,853 E | 9/2002 | Detering et al. | 75/10.19 |
| 6,444,009 B1 | 9/2002 | Liu et al. | 75/332 |
| 6,475,951 B1 | 11/2002 | Domesle et al. | |
| 6,488,904 B1 | 12/2002 | Cox et al. | |
| 6,506,995 B1 * | 1/2003 | Fusaro et al. | 219/72 |
| 6,517,800 B1 | 2/2003 | Cheng et al. | 423/447.1 |
| 6,524,662 B2 | 2/2003 | Jang et al. | 427/535 |
| 6,531,704 B2 | 3/2003 | Yadav et al. | 250/493.1 |
| 6,548,445 B1 | 4/2003 | Buysch et al. | |
| 6,554,609 B2 | 4/2003 | Yadav et al. | 432/9 |
| 6,562,304 B1 | 5/2003 | Mizrahi | |
| 6,562,495 B2 | 5/2003 | Yadav et al. | 429/12 |
| 6,569,393 B1 | 5/2003 | Hoke et al. | |
| 6,569,397 B1 | 5/2003 | Yadav et al. | 423/345 |
| 6,569,518 B2 | 5/2003 | Yadav et al. | 428/323 |
| 6,572,672 B2 | 6/2003 | Yadav et al. | 75/343 |
| 6,579,446 B1 | 6/2003 | Teran et al. | |
| 6,596,187 B2 | 7/2003 | Coll et al. | 216/56 |
| 6,603,038 B1 | 8/2003 | Hagemeyer et al. | 560/241.1 |
| 6,607,821 B2 | 8/2003 | Yadav et al. | 428/323 |
| 6,610,355 B2 | 8/2003 | Yadav et al. | 427/115 |
| 6,623,559 B2 | 9/2003 | Huang | 117/87 |
| 6,635,357 B2 | 10/2003 | Moxson et al. | 428/548 |
| 6,641,775 B2 | 11/2003 | Vigliotti et al. | 264/618 |
| 6,652,822 B2 | 11/2003 | Phillips et al. | 423/290 |
| 6,652,967 B2 | 11/2003 | Yadav et al. | 428/403 |
| 6,669,823 B1 | 12/2003 | Sarkas et al. | 204/164 |
| 6,682,002 B2 | 1/2004 | Kyotani | 239/318 |
| 6,689,192 B1 | 2/2004 | Phillips et al. | 75/342 |
| 6,699,398 B1 | 3/2004 | Kim | 216/55 |
| 6,706,097 B2 | 3/2004 | Zornes | 96/153 |
| 6,706,660 B2 | 3/2004 | Park | |
| 6,710,207 B2 | 3/2004 | Bogan, Jr. et al. | |
| 6,713,176 B2 | 3/2004 | Yadav et al. | 428/402 |
| 6,716,525 B1 | 4/2004 | Yadav et al. | 428/402 |
| 6,744,006 B2 * | 6/2004 | Johnson et al. | 219/121.51 |
| 6,746,791 B2 | 6/2004 | Yadav et al. | 429/30 |
| 6,772,584 B2 | 8/2004 | Chun et al. | 60/275 |
| 6,786,950 B2 | 9/2004 | Yadav et al. | 75/346 |
| 6,813,931 B2 | 11/2004 | Yadav et al. | 73/31.05 |
| 6,817,388 B2 | 11/2004 | Tsangaris et al. | 141/82 |
| 6,832,735 B2 | 12/2004 | Yadav et al. | 241/16 |
| 6,838,072 B1 | 1/2005 | Kong et al. | 423/594.2 |
| 6,841,509 B1 | 1/2005 | Hwang et al. | |
| 6,855,410 B2 | 2/2005 | Buckley | |
| 6,855,426 B2 | 2/2005 | Yadav | 428/403 |
| 6,855,749 B1 | 2/2005 | Yadav et al. | 523/105 |
| 6,858,170 B2 | 2/2005 | Van Thillo et al. | |
| 6,886,545 B1 | 5/2005 | Holm | 123/568.21 |
| 6,896,958 B1 | 5/2005 | Cayton et al. | 428/323 |
| 6,902,699 B2 | 6/2005 | Fritzemeier et al. | 419/38 |
| 6,916,872 B2 | 7/2005 | Yadav et al. | 524/430 |
| 6,919,065 B2 | 7/2005 | Zhou et al. | |
| 6,919,527 B1 | 7/2005 | Boulos et al. | 219/121.52 |
| 6,933,331 B2 | 8/2005 | Yadav et al. | 523/210 |
| 6,972,115 B1 | 12/2005 | Ballard | |
| 6,986,877 B2 | 1/2006 | Takikawa et al. | 423/447.3 |
| 6,994,837 B2 | 2/2006 | Boulos et al. | 423/613 |
| 7,007,872 B2 | 3/2006 | Yadav et al. | 241/1 |
| 7,022,305 B2 | 4/2006 | Drumm et al. | |
| 7,052,777 B2 | 5/2006 | Brotzman, Jr. et al. | 428/570 |
| 7,073,559 B2 | 7/2006 | O'Larey et al. | 164/76.1 |
| 7,081,267 B2 | 7/2006 | Yadav | 427/115 |
| 7,101,819 B2 | 9/2006 | Rosenflanz et al. | 501/10 |
| 7,147,544 B2 | 12/2006 | Rosenflanz | 451/28 |
| 7,147,894 B2 | 12/2006 | Zhou et al. | 427/256 |
| 7,166,198 B2 | 1/2007 | Van Der Walt et al. | 204/165 |
| 7,166,663 B2 | 1/2007 | Cayton et al. | 524/430 |
| 7,172,649 B2 | 2/2007 | Conrad et al. | 106/35 |
| 7,172,790 B2 | 2/2007 | Koulik et al. | |
| 7,178,747 B2 | 2/2007 | Yadav et al. | 241/23 |
| 7,208,126 B2 | 4/2007 | Musick et al. | 423/69 |
| 7,211,236 B2 | 5/2007 | Stark et al. | 423/592.1 |
| 7,217,407 B2 | 5/2007 | Zhang | 423/610 |
| 7,220,398 B2 | 5/2007 | Sutorik et al. | 423/593.1 |
| 7,255,498 B2 | 8/2007 | Bush et al. | |
| 7,265,076 B2 | 9/2007 | Taguchi et al. | |
| 7,282,167 B2 | 10/2007 | Carpenter | |
| 7,307,195 B2 | 12/2007 | Polverejan et al. | 585/443 |
| 7,323,655 B2 | 1/2008 | Kim | 219/121.43 |
| 7,384,447 B2 | 6/2008 | Kodas et al. | 75/332 |
| 7,402,899 B1 | 7/2008 | Whiting et al. | |
| 7,417,008 B2 | 8/2008 | Richards et al. | |
| 7,494,527 B2 | 2/2009 | Jurewicz et al. | 75/346 |
| 7,517,826 B2 | 4/2009 | Fujdala et al. | |
| 7,534,738 B2 | 5/2009 | Fujdala et al. | |
| 7,541,012 B2 | 6/2009 | Yeung et al. | |
| 7,541,310 B2 | 6/2009 | Espinoza et al. | |
| 7,557,324 B2 * | 7/2009 | Nylen et al. | 219/121.47 |
| 7,572,315 B2 | 8/2009 | Boulos et al. | 75/336 |
| 7,576,029 B2 | 8/2009 | Saito et al. | |
| 7,576,031 B2 | 8/2009 | Beutel et al. | |
| 7,604,843 B1 | 10/2009 | Robinson et al. | |
| 7,611,686 B2 | 11/2009 | Alekseeva et al. | 423/276 |
| 7,615,097 B2 | 11/2009 | McKechnie et al. | 75/346 |
| 7,618,919 B2 | 11/2009 | Shimazu et al. | |
| 7,622,693 B2 | 11/2009 | Foret | 219/121.43 |
| 7,632,775 B2 | 12/2009 | Zhou et al. | |
| 7,635,218 B1 | 12/2009 | Lott | |
| 7,674,744 B2 | 3/2010 | Shiratori et al. | |
| 7,678,419 B2 | 3/2010 | Kevwitch et al. | |
| 7,704,369 B2 | 4/2010 | Olah et al. | |
| 7,709,411 B2 | 5/2010 | Zhou et al. | |
| 7,709,414 B2 | 5/2010 | Fujdala et al. | |
| 7,745,367 B2 | 6/2010 | Fujdala et al. | |
| 7,750,265 B2 * | 7/2010 | Belashchenko | 219/121.47 |
| 7,803,210 B2 | 9/2010 | Sekine et al. | 75/334 |
| 7,851,405 B2 | 12/2010 | Wakamatsu et al. | |
| 7,874,239 B2 | 1/2011 | Howland | |
| 7,875,573 B2 | 1/2011 | Beutel et al. | |
| 7,897,127 B2 | 3/2011 | Layman et al. | |
| 7,902,104 B2 | 3/2011 | Kalck | |
| 7,905,942 B1 | 3/2011 | Layman | |
| 7,935,655 B2 | 5/2011 | Tolmachev | |
| 8,051,724 B1 | 11/2011 | Layman et al. | |
| 8,076,258 B1 | 12/2011 | Biberger | |
| 8,080,494 B2 | 12/2011 | Yasuda et al. | |
| 8,089,495 B2 | 1/2012 | Keller | |
| 8,142,619 B2 | 3/2012 | Layman et al. | |
| 8,168,561 B2 | 5/2012 | Virkar | |
| 8,173,572 B2 | 5/2012 | Feaviour | |
| 8,211,392 B2 | 7/2012 | Grubert et al. | |
| 8,258,070 B2 | 9/2012 | Fujdala et al. | |
| 8,278,240 B2 | 10/2012 | Tange et al. | |
| 8,294,060 B2 * | 10/2012 | Mohanty et al. | 219/121.37 |
| 8,309,489 B2 | 11/2012 | Cuenya et al. | |
| 8,349,761 B2 | 1/2013 | Xia et al. | |
| 8,557,727 B2 | 10/2013 | Yin et al. | |
| 2001/0004009 A1 | 6/2001 | MacKelvie | |
| 2001/0042802 A1 | 11/2001 | Youds | 241/5 |
| 2001/0055554 A1 | 12/2001 | Hoke et al. | |
| 2002/0018815 A1 | 2/2002 | Sievers et al. | 424/489 |
| 2002/0068026 A1 | 6/2002 | Murrell et al. | 422/211 |
| 2002/0071800 A1 | 6/2002 | Hoke et al. | |
| 2002/0079620 A1 | 6/2002 | Dubuis et al. | 264/328.14 |
| 2002/0100751 A1 | 8/2002 | Carr | 219/209 |
| 2002/0102674 A1 | 8/2002 | Anderson | 435/174 |
| 2002/0131914 A1 | 9/2002 | Sung | |
| 2002/0143417 A1 | 10/2002 | Ito et al. | |
| 2002/0182735 A1 | 12/2002 | Kibby et al. | |
| 2002/0183191 A1 | 12/2002 | Faber et al. | |
| 2002/0192129 A1 | 12/2002 | Shamouilian et al. | |
| 2003/0036786 A1 | 2/2003 | Duren et al. | 607/96 |
| 2003/0042232 A1 | 3/2003 | Shimazu | 219/121.47 |
| 2003/0047617 A1 * | 3/2003 | Shanmugham et al. | 239/13 |
| 2003/0066800 A1 | 4/2003 | Saim et al. | 264/5 |
| 2003/0108459 A1 | 6/2003 | Wu et al. | 422/186.04 |
| 2003/0110931 A1 | 6/2003 | Aghajanian et al. | |
| 2003/0129098 A1 | 7/2003 | Endo et al. | |

(56) References Cited

U.S. PATENT DOCUMENTS

| | | |
|---|---|---|
| 2003/0139288 A1 | 7/2003 | Cai et al. |
| 2003/0143153 A1 | 7/2003 | Boulos et al. |
| 2003/0172772 A1 | 9/2003 | Sethuram et al. ............... 501/87 |
| 2003/0223546 A1 | 12/2003 | McGregor et al. ............ 378/143 |
| 2004/0009118 A1 | 1/2004 | Phillips et al. ............. 423/592.1 |
| 2004/0023302 A1 | 2/2004 | Archibald et al. ............. 435/7.1 |
| 2004/0023453 A1 | 2/2004 | Xu et al. ....................... 257/369 |
| 2004/0077494 A1 | 4/2004 | LaBarge et al. ............... 502/303 |
| 2004/0103751 A1 | 6/2004 | Joseph et al. ................ 75/10.19 |
| 2004/0109523 A1 | 6/2004 | Singh et al. |
| 2004/0119064 A1 | 6/2004 | Narayan et al. |
| 2004/0127586 A1 | 7/2004 | Jin et al. |
| 2004/0129222 A1* | 7/2004 | Nylen et al. ............... 118/723 R |
| 2004/0166036 A1 | 8/2004 | Chen et al. |
| 2004/0167009 A1 | 8/2004 | Kuntz et al. .................. 501/95.2 |
| 2004/0176246 A1 | 9/2004 | Shirk et al. .................... 502/439 |
| 2004/0208805 A1 | 10/2004 | Fincke et al. |
| 2004/0213998 A1 | 10/2004 | Hearley et al. ................. 428/402 |
| 2004/0238345 A1 | 12/2004 | Koulik et al. |
| 2004/0251017 A1 | 12/2004 | Pillion et al. .................. 165/289 |
| 2004/0251241 A1 | 12/2004 | Blutke et al. |
| 2005/0000321 A1 | 1/2005 | O'Larey et al. ................. 75/952 |
| 2005/0000950 A1 | 1/2005 | Schroder et al. ......... 219/121.59 |
| 2005/0066805 A1 | 3/2005 | Park et al. |
| 2005/0070431 A1 | 3/2005 | Alvin et al. |
| 2005/0077034 A1 | 4/2005 | King .............................. 165/163 |
| 2005/0097988 A1 | 5/2005 | Kodas et al. ..................... 75/332 |
| 2005/0106865 A1 | 5/2005 | Chung et al. |
| 2005/0133121 A1 | 6/2005 | Subramanian et al. |
| 2005/0163673 A1 | 7/2005 | Johnson et al. |
| 2005/0199739 A1 | 9/2005 | Kuroda et al. ................... 239/13 |
| 2005/0220695 A1 | 10/2005 | Abatzoglou et al. .......... 423/445 |
| 2005/0227864 A1 | 10/2005 | Sutorik et al. |
| 2005/0233380 A1 | 10/2005 | Pesiri et al. .................... 435/7.1 |
| 2005/0240069 A1 | 10/2005 | Polverejan et al. ............ 585/444 |
| 2005/0258766 A1 | 11/2005 | Kim .......................... 315/111.21 |
| 2005/0275143 A1 | 12/2005 | Toth |
| 2006/0051505 A1 | 3/2006 | Kortshagen et al. .......... 427/212 |
| 2006/0068989 A1 | 3/2006 | Ninomiya et al. ............. 502/339 |
| 2006/0094595 A1 | 5/2006 | Labarge |
| 2006/0096393 A1 | 5/2006 | Pesiri .......................... 73/863.21 |
| 2006/0105910 A1 | 5/2006 | Zhou et al. ..................... 502/338 |
| 2006/0108332 A1 | 5/2006 | Belashchenko .......... 219/121.47 |
| 2006/0153728 A1 | 7/2006 | Schoenung et al. ............. 419/32 |
| 2006/0153765 A1 | 7/2006 | Pham-Huu et al. ............ 423/345 |
| 2006/0159596 A1 | 7/2006 | De La Veaux et al. ........ 422/151 |
| 2006/0166809 A1 | 7/2006 | Malek et al. |
| 2006/0211569 A1 | 9/2006 | Dang et al. |
| 2006/0213326 A1 | 9/2006 | Gollob et al. |
| 2006/0222780 A1 | 10/2006 | Gurevich et al. |
| 2006/0231525 A1 | 10/2006 | Asakawa et al. ................. 216/56 |
| 2007/0048206 A1 | 3/2007 | Hung et al. .................... 423/335 |
| 2007/0049484 A1 | 3/2007 | Kear et al. |
| 2007/0063364 A1 | 3/2007 | Hsiao et al. ......................... 264/5 |
| 2007/0084308 A1 | 4/2007 | Nakamura et al. ............... 75/346 |
| 2007/0084834 A1 | 4/2007 | Hanus et al. ................. 219/121.5 |
| 2007/0087934 A1 | 4/2007 | Martens et al. ................ 502/214 |
| 2007/0163385 A1 | 7/2007 | Takahashi et al. |
| 2007/0173403 A1 | 7/2007 | Koike et al. .................... 502/300 |
| 2007/0178673 A1 | 8/2007 | Gole et al. |
| 2007/0221404 A1 | 9/2007 | Das et al. |
| 2007/0253874 A1 | 11/2007 | Foret ......................... 422/186.07 |
| 2007/0292321 A1 | 12/2007 | Plischke et al. ................ 422/198 |
| 2008/0006954 A1 | 1/2008 | Yubuta et al. |
| 2008/0026041 A1 | 1/2008 | Tepper et al. |
| 2008/0031806 A1 | 2/2008 | Gavenonis et al. |
| 2008/0038578 A1 | 2/2008 | Li |
| 2008/0045405 A1 | 2/2008 | Beutel et al. |
| 2008/0047261 A1 | 2/2008 | Han et al. |
| 2008/0057212 A1* | 3/2008 | Dorier et al. ................... 427/446 |
| 2008/0064769 A1 | 3/2008 | Sato et al. |
| 2008/0104735 A1 | 5/2008 | Howland |
| 2008/0105083 A1 | 5/2008 | Nakamura et al. ............... 75/255 |
| 2008/0116178 A1 | 5/2008 | Weidman .................. 219/121.47 |
| 2008/0125308 A1 | 5/2008 | Fujdala et al. |
| 2008/0125313 A1 | 5/2008 | Fujdala et al. |
| 2008/0138651 A1 | 6/2008 | Doi et al. |
| 2008/0175936 A1 | 7/2008 | Tokita et al. |
| 2008/0187714 A1 | 8/2008 | Wakamatsu et al. |
| 2008/0206562 A1 | 8/2008 | Stucky et al. |
| 2008/0207858 A1 | 8/2008 | Kowaleski et al. |
| 2008/0248704 A1 | 10/2008 | Mathis et al. |
| 2008/0274344 A1 | 11/2008 | Vieth et al. |
| 2008/0277092 A1 | 11/2008 | Layman et al. |
| 2008/0277264 A1 | 11/2008 | Sprague |
| 2008/0277266 A1 | 11/2008 | Layman |
| 2008/0277267 A1 | 11/2008 | Biberger et al. |
| 2008/0277268 A1 | 11/2008 | Layman |
| 2008/0277269 A1 | 11/2008 | Layman et al. |
| 2008/0277270 A1 | 11/2008 | Biberger et al. |
| 2008/0277271 A1 | 11/2008 | Layman |
| 2008/0280049 A1 | 11/2008 | Kevwitch et al. |
| 2008/0280751 A1 | 11/2008 | Harutyunyan et al. |
| 2008/0280756 A1 | 11/2008 | Biberger |
| 2008/0283411 A1 | 11/2008 | Eastman et al. |
| 2008/0283498 A1 | 11/2008 | Yamazaki |
| 2009/0010801 A1 | 1/2009 | Murphy et al. |
| 2009/0054230 A1 | 2/2009 | Veeraraghavan et al. |
| 2009/0088585 A1 | 4/2009 | Schammel et al. |
| 2009/0092887 A1 | 4/2009 | McGrath et al. |
| 2009/0098402 A1 | 4/2009 | Kang et al. |
| 2009/0114568 A1 | 5/2009 | Trevino et al. |
| 2009/0162991 A1 | 6/2009 | Beneyton et al. |
| 2009/0168506 A1 | 7/2009 | Han et al. |
| 2009/0170242 A1 | 7/2009 | Lin et al. |
| 2009/0181474 A1 | 7/2009 | Nagai |
| 2009/0200180 A1 | 8/2009 | Capote et al. |
| 2009/0208367 A1 | 8/2009 | Calio et al. |
| 2009/0209408 A1 | 8/2009 | Kitamura et al. |
| 2009/0223410 A1 | 9/2009 | Jun et al. |
| 2009/0253037 A1 | 10/2009 | Park et al. |
| 2009/0274903 A1 | 11/2009 | Addiego |
| 2009/0286899 A1 | 11/2009 | Hofmann et al. |
| 2009/0324468 A1 | 12/2009 | Golden et al. |
| 2010/0089002 A1 | 4/2010 | Merkel |
| 2010/0092358 A1 | 4/2010 | Koegel et al. |
| 2010/0124514 A1 | 5/2010 | Chelluri et al. |
| 2010/0166629 A1 | 7/2010 | Deeba |
| 2010/0180581 A1 | 7/2010 | Grubert et al. |
| 2010/0180582 A1 | 7/2010 | Mueller-Stach et al. |
| 2010/0186375 A1 | 7/2010 | Kazi et al. |
| 2010/0240525 A1 | 9/2010 | Golden et al. |
| 2010/0275781 A1 | 11/2010 | Tsangaris |
| 2011/0006463 A1 | 1/2011 | Layman |
| 2011/0052467 A1 | 3/2011 | Chase et al. |
| 2011/0143915 A1 | 6/2011 | Yin et al. |
| 2011/0143916 A1 | 6/2011 | Leamon |
| 2011/0143926 A1 | 6/2011 | Yin et al. |
| 2011/0143930 A1 | 6/2011 | Yin et al. |
| 2011/0143933 A1 | 6/2011 | Yin et al. |
| 2011/0144382 A1 | 6/2011 | Yin et al. |
| 2011/0152550 A1 | 6/2011 | Grey et al. |
| 2011/0158871 A1 | 6/2011 | Arnold et al. |
| 2011/0174604 A1 | 7/2011 | Duesel et al. |
| 2011/0243808 A1 | 10/2011 | Fossey et al. |
| 2011/0245073 A1 | 10/2011 | Oljaca et al. |
| 2011/0247336 A9 | 10/2011 | Farsad et al. |
| 2011/0305612 A1 | 12/2011 | Müller-Stach et al. |
| 2012/0023909 A1 | 2/2012 | Lambert et al. |
| 2012/0045373 A1 | 2/2012 | Biberger |
| 2012/0097033 A1 | 4/2012 | Arnold et al. |
| 2012/0122660 A1 | 5/2012 | Andersen et al. |
| 2012/0124974 A1 | 5/2012 | Li et al. |
| 2012/0171098 A1 | 7/2012 | Hung et al. |
| 2012/0308467 A1 | 12/2012 | Carpenter et al. |
| 2013/0213018 A1 | 8/2013 | Yin et al. |
| 2013/0280528 A1 | 10/2013 | Biberger |
| 2013/0281288 A1 | 10/2013 | Biberger et al. |
| 2013/0316896 A1 | 11/2013 | Biberger |

(56) References Cited

U.S. PATENT DOCUMENTS

| | | |
|---|---|---|
| 2013/0345047 A1 | 12/2013 | Biberger et al. |
| 2014/0018230 A1 | 1/2014 | Yin et al. |

FOREIGN PATENT DOCUMENTS

| | | | | |
|---|---|---|---|---|
| GB | 1 307 941 A | 2/1973 | | |
| JP | 56-146804 | 11/1981 | ............... | B22F 9/08 |
| JP | 61-086815 A | 5/1986 | | |
| JP | 62-102827 A | 5/1987 | | |
| JP | 63-214342 A | 9/1988 | | |
| JP | 1-164795 A | 6/1989 | | |
| JP | 05-228361 A | 9/1993 | | |
| JP | 05-324094 A | 12/1993 | | |
| JP | 6-93309 A | 4/1994 | | |
| JP | 6-135797 A | 5/1994 | | |
| JP | 06272012 A * | 9/1994 | ............... | C23C 4/04 |
| JP | H6-065772 | 9/1994 | | |
| JP | 7031873 A | 2/1995 | | |
| JP | 07-256116 | 10/1995 | | |
| JP | 8-158033 A | 6/1996 | | |
| JP | 10-130810 A | 5/1998 | | |
| JP | 11-502760 A | 3/1999 | | |
| JP | 2000-220978 A | 8/2000 | | |
| JP | 2002-88486 A | 3/2002 | | |
| JP | 2002-336688 A | 11/2002 | | |
| JP | 2003-126694 A | 5/2003 | | |
| JP | 2004-233007 A | 8/2004 | | |
| JP | 2004-249206 A | 9/2004 | | |
| JP | 2004-290730 A | 10/2004 | | |
| JP | 2005-503250 A | 2/2005 | | |
| JP | 2005-122621 A | 5/2005 | | |
| JP | 2005-218937 A | 8/2005 | | |
| JP | 2005-342615 A | 12/2005 | | |
| JP | 2006-001779 A | 1/2006 | | |
| JP | 2006-508885 A | 3/2006 | | |
| JP | 2006-247446 A | 9/2006 | | |
| JP | 2006-260385 A | 9/2006 | | |
| JP | 2007-46162 A | 2/2007 | | |
| JP | 2007-203129 A | 8/2007 | | |
| SU | 493241 | 3/1976 | | |
| TW | 200611449 | 4/2006 | | |
| TW | 201023207 | 6/2010 | | |
| WO | WO-96/28577 A1 | 9/1996 | | |
| WO | WO 02/092503 A1 | 11/2002 | ............ | C01B 21/064 |
| WO | WO 2004/052778 A2 | 6/2004 | ............ | C01B 13/28 |
| WO | WO-2005/063390 A1 | 7/2005 | | |
| WO | WO 2006/079213 A1 | 8/2006 | ................ | B01J 2/04 |
| WO | WO-2008/130451 A2 | 10/2008 | | |
| WO | WO-2008/130451 A3 | 10/2008 | | |
| WO | WO-2011/081833 A1 | 7/2011 | | |

OTHER PUBLICATIONS

Dr. Heike Mühlenweg et al., "Gas-Phase Reactions—Open Up New Roads to Nanoproducts", Degussa ScienceNewsletter No. 08, 2004, pp. 12-16.
Coating Generation: Vaporization of Particles in Plasma Spraying and Splat Formation, M. Vardelle, A. Vardelle, K-I li, P. Fauchais, Universite de Limoges,123 Avenue A. Thomas 87000, Limoges , F., Pure & Chem, vol. 68, No. 5, pp. 1093-1099, 1996.
H. Konrad et al., "Nanostructured Cu-Bi Alloys Prepared by Co-Evaporation in a Continuous Gas Flow," vol. 7, No. 6, 1996, pp. 605-610.
Kenvin et al. "Supported Catalysts Prepared from Mononuclear Copper Complexes: Catalytic Properties", Journal of Catalysis, pp. 81-91, (1992).
J. Heberlein, "New Approaches in Thermal Plasma Technology", Pure Appl. Chem., vol. 74, No. 3, 2002, pp. 327-335.
M. Vardelle et al., "Experimental Investigation of Powder Vaporization in Thermal Plasma Jets," Plasma Chemistry and Plasma Processing, vol. 11, No. 2, Jun. 1991, pp. 185-201.
National Aeronautics and Space Administration, "Enthalpy", http://www.grc.nasa.gov/WWW/K-12/airplane/enthalpy.html, Nov. 23, 2009, 1 page.

P. Fauchais et al., "Plasma Spray: Study of the Coating Generation," Ceramics International, Elsevier, Amsterdam, NL, vol. 22, No. 4, Jan. 1996, pp. 295-303.
P. Fauchais et al., "Les Dépôts Par Plasma Thermique," Revue Generale De L'Electricitie, RGE. Paris, FR, No. 2, Jan. 1993, 7-12.
P. Fauchais et al, "La Projection Par Plasma: Une Revue," Annales De Physique, vol. 14, No. 3, Jun. 1989, pp. 261-310.
T. Yoshida, "The Future of Thermal Plasma Processing for Coating", Pure & Appl. Chem., vol. 66, No. 6, 1994 pp. 1223-1230.
Han et al., Deformation Mechanisms and Ductility of Nanostructured Al Alloys, Mat. Res. Soc. Symp. Proc. vol. 821, Jan. 2004, Material Research Society, http://www.mrs.org/s_mrs/bin.asp?CID=2670&DOC=FILE.PDF., 6 pages.
Nagai, Yasutaka, et al., "Sintering Inhibition Mechanism of Platinum Supported on Ceria-based Oxide and Pt-oxide-support Interaction,"Journal of Catalysis 242 (2006), pp. 103-109, Jul. 3, 2006, Elsevier.
Young, Lee W. International Searching Authority, International Search Report and Written Opinion for Application No. PCT/US10/60140, mailed Feb. 11, 2011, 10 pgs.
English Abstract for publication No. SU 193241 A, Application No. 1973SU1943286 filed on Jul. 2, 1973, published on Mar. 1, 1976, entitled "Catalyst for Ammonia Synthesis Contains Oxides of Aluminium, Potassium, Calcium, Iron and Nickel Oxide for Increased Activity," 3 pgs.
Bateman, J. E. et al. (Dec. 17, 1998). "Alkylation of Porous Silicon by Direct Reaction with Alkenes and Alkynes," *Angew. Chem Int. Ed.* 37(19):2683-2685.
Carrot, G. et al. (Sep. 17, 2002). "Surface-Initiated Ring-Opening Polymerization: A Versatile Method for Nanoparticle Ordering," *Macromolecules* 35(22):8400-8404.
Chen, H.-S. et al. (Jul. 3, 2001). "On the Photoluminescence of Si Nanoparticles," *Mater. Phys. Mech.* 4:62-66.
Fojtik, A. et al. (Apr. 29, 1994). "Luminescent Colloidal Silicon Particles," *Chemical Physics Letters* 221:363-367.
Fojtik, A. (Jan. 13, 2006). "Surface Chemistry of Luminescent Colloidal Silicon Nanoparticles," *J. Phys. Chem. B*. 110(5):1994-1998.
Hua, F. et al. (Mar. 2006). "Organically Capped Silicon Nanoparticles With Blue Photoluminescence Prepared by Hydrosilylation Followed by Oxidation," *Langmuir* 22(9):4363-4370.
Ji, Y. et al. (Nov. 2002) "Processing and Mechanical Properties of $Al_2O_3$-5 vol.% Cr Nanocomposites," *Journal of the European Ceramic Society* 22(12):1927-1936.
Jouet, R. J. et al. (Jan. 25, 2005). "Surface Passivation of Bare Aluminum Nanoparticles Using Perfluoroalkyl Carboxylic Acids," *Chem. Mater.*17(11):2987-2996.
Kim, N. Y. et al. (Mar. 5, 1997). "Thermal Derivatization of Porous Silicon with Alcohols," *J. Am. Chem. Soc.* 119(9):2297-2298.
Kwon, Y.-S. et al. (Apr. 30, 2003). "Passivation Process for Superfine Aluminum Powders Obtained by Electrical Explosion of Wires," *Applied Surface Science* 211:57-67.
Langner, A. et al. (Aug. 25, 2005). "Controlled Silicon Surface Functionalization by Alkene Hydrosilylation," *J. Am. Chem. Soc.* 127(37):12798-12799.
Li, D. et al. (Apr. 9, 2005). "Environmentally Responsive "Hairy" Nanoparticles: Mixed Homopolymer Brushes on Silica Nanoparticles Synthesized by Living Radical Polymerization Techniques," J. Am. Chem. Soc. 127(7):6248-6256.
Li, X. et al. (May 25, 2004). "Surface Functionalization of Silicon Nanoparticles Produced by Laser-Driven Pyrolysis of Silane Followed by HF-$HNO_3$ Etching," *Langmuir* 20(11):4720-4727.
Liao, Y.-C. et al. (Jun. 27, 2006). "Self-Assembly of Organic Monolayers on Aerosolized Silicon Nanoparticles," *J.Am. Chem. Soc.* 128(28):9061-9065.
Liu, S.-M. et al. (Jan. 13, 2006). "Enhanced Photoluminescence from Si Nano-Organosols by Functionalization With Alkenes and Their Size Evolution," *Chem. Mater*. 18(3):637-642.
Neiner, D. (Aug. 5, 2006). "Low-Temperature Solution Route to Macroscopic Amounts of Hydrogen Terminated Silicon Nanoparticles," *J. Am. Chem. Soc.* 128:11016-11017.
Netzer, L. et al. (1983). "A New Approach to Construction of Artificial Monolayer Assemblies," *J. Am. Chem. Soc.* 105(3):674-676.

(56) References Cited

OTHER PUBLICATIONS

"Platinum Group Metals: Annual Review 1996" (Oct. 1997). Engineering and Mining Journal, p. 63.
Rahaman, R. A. et al. (1995). "Synthesis of Powders," in *Ceramic Processing and Sintering*. Marcel Decker, Inc., New York, pp. 71-77.
Sailor, M. J. (1997). "Surface Chemistry of Luminescent Silicon Nanocrystallites," *Adv. Mater.* 9(10):783-793.
Stiles, A. B. (Jan. 1, 1987). "Manufacture of Carbon-Supported Metal Catalysts," in *Catalyst Supports and Supported Catalysts*, Butterworth Publishers, MA, pp. 125-132.
Subramanian, S. et al. (1991). "Structure and Activity of Composite Oxide Supported Platinum-Iridium Catalysts," *Applied Catalysts* 74: 65-81.
Tao, Y.-T. (May 1993). "Structural Comparison of Self-Assembled Monolayers of *n*-Alkanoic Acids on the surfaces of Silver, Copper, and Aluminum," *J. Am. Chem. Soc.* 115(10):4350-4358.
Ünal, N. et al. (Nov. 2011). "Influence of WC Particles on the Microstructural and Mechanical Properties of 3 mol% $Y_2O_3$ Stabilized $ZrO_2$ Matrix Composites Produced by Hot Pressing," Journal of the European Ceramic Society (31)13: 2267-2275.
Zou, J. et al. (Jun. 4, 2004). "Solution Synthesis of Ultrastable Luminescent Siloxane-Coated Silicon Nanoparticles," *Nano Letters* 4(7):1181-1186.
U.S. Appl. No. 13/291,983, filed Nov. 8, 2011, for Layman et al.
U.S. Appl. No. 12/152,084, filed May 9, 2008, for Biberger.
U.S. Appl. No. 13/028,693, filed Feb. 16, 2011, for Biberger.
U.S. Appl. No. 12/943,909, filed Nov. 10, 2010, for Layman.
U.S. Appl. No. 12/152,111, filed May 9, 2008, for Biberger et al.
U.S. Appl. No. 12/151,830, filed May 8, 2008, for Biberger et al.
U.S. Appl. No. 12/968,248, filed Dec. 14, 2010, for Biberger.
U.S. Appl. No. 12/968,245, filed Dec. 14, 2010, for Biberger.
U.S. Appl. No. 12/968,241, filed Dec. 14, 2010, for Biberger.
U.S. Appl. No. 12/968,239, filed Dec. 14, 2010, for Biberger.
U.S. Appl. No. 12/969,128, filed Dec. 15, 2010, for Biberger.
U.S. Appl. No. 12/962,463, filed Dec. 7, 2010, for Leamon.
U.S. Appl. No. 12/961,030, filed Dec. 6, 2010, for Lehman.
U.S. Appl. No. 12/961,108, filed Dec. 6, 2010, for Lehman.
U.S. Appl. No. 12/961,200, filed Dec. 6, 2010, for Lehman.
U.S. Appl. No. 12/968,253, filed Dec. 14, 2010, for Biberger.
U.S. Appl. No. 12/968,235, filed Dec. 14, 2010, for Biberger.
U.S. Appl. No. 12/969,306, filed Dec. 15, 2010, for Lehman et al.
U.S. Appl. No. 12/969,447, filed Dec. 15, 2010, for Biberger et al.
U.S. Appl. No. 12/969,087, filed Dec. 15, 2010, for Biberger.
U.S. Appl. No. 12/962,533, filed Dec. 7, 2010, for Yin et al.
U.S. Appl. No. 12/962,523, filed Dec. 7, 2010, for Yin et al.
U.S. Appl. No. 12/001,643, filed Dec. 11, 2007, for Biberger et al.
U.S. Appl. No. 12/474,081, filed May 28, 2009, for Biberger et al.
U.S. Appl. No. 12/001,602, filed Dec. 11, 2007, for Biberger et al.
U.S. Appl. No. 12/001,644, filed Dec. 11, 2007, for Biberger et al.
U.S. Appl. No. 12/969,457, filed Nov. 15, 2010, for Leamon et al.
U.S. Appl. No. 12/969,503, filed Nov. 15, 2010, for Leamon et al.
U.S. Appl. No. 12/954,813, filed Nov. 26, 2010, for Biberger.
U.S. Appl. No. 12/954,822, filed Nov. 26, 2010, for Biberger.
U.S. Appl. No. 13/033,514, filed Feb. 23, 2011, for Biberger et al.
U.S. Appl. No. 13/589,024, filed Aug. 17, 2012, for Yin et al.
Babin, A. et al. (1985). "Solvents Used in the Arts," *Center for Safety in the Arts*: 16 pages.
Chen, W.-J. et al. (Mar. 18, 2008). "Functional $Fe_3O_4/TiO_2$ Core/Shell Magnetic Nanoparticles as Photokilling Agents for Pathogenic Bacteria," *Small* 4(4): 485-491.
Faber, K. T. et al. (Sep. 1988). "Toughening by Stress-Induced Microcracking in Two-Phase Ceramics," *Journal of the American Ceramic Society* 71: C-399-C401.
Gangeri, M. et al. (2009). "Fe and Pt Carbon Nanotubes for the Electrocatalytic Conversion of Carbon Dioxide to Oxygenates," *Catalysis Today* 143: 57-63.
Luo, J. et al. (2008). "Core/Shell Nanoparticles as Electrocatalysts for Fuel Cell Reactions," *Advanced Materials* 20: 4342-4347.
Mignard, D. et al. (2003). "Methanol Synthesis from Flue-Gas $CO_2$ and Renewable Electricity: A Feasibility Study," *International Journal of Hydrogen Energy* 28: 455-464.
Park, H.-Y. et al. (May 30, 2007). "Fabrication of Magnetic Core@Shell Fe Oxide@Au Nanoparticles for Interfacial Bioactivity and Bio-Separation," *Langmuir* 23: 9050-9056.
Park, N.-G. et al. (Feb. 17, 2004). "Morphological and Photoelectrochemical Characterization of Core-Shell Nanoparticle Films for Dye-Sensitized Solar Cells: Zn-O Type Shell on $SnO_2$ and $TiO_2$ Cores," *Langmuir* 20: 4246-4253.
"Plasma Spray and Wire Flame Spray Product Group," located at http://www.processmaterials.com/spray.html, published by Process Materials, Inc., last accessed Aug. 5, 2013, 2 pages.
U.S. Appl. No. 13/801,726, filed Mar. 13, 2013, for Qi et al.

\* cited by examiner

NON-PLUGGING D.C. PLASMA GUN

CROSS-REFERENCE TO RELATED APPLICATIONS

This application claims priority to U.S. Provisional Patent Application Ser. No. 61/284,329, filed Dec. 15, 2009 and entitled "MATERIALS PROCESSING," which is hereby incorporated herein by reference in its entirety as if set forth herein.

FIELD OF THE INVENTION

The present invention relates to the field of powder material processing. More specifically, the present invention relates to powder material processing using a plasma gun.

BACKGROUND OF THE INVENTION

FIG. 1 illustrates one embodiment of a plasma gun 100 used to process powder material. The plasma gun 100 is a DC plasma torch including a male electrode 120 and a female electrode 130. A power supply (not shown) is connected to the male electrode 120 and the female electrode 130 and delivers power through the plasma gun 100 by passing current across the gap 160 between the male electrode 120 and the female electrode 130. Furthermore, the plasma gun 100 includes a gas inlet 140 fluidly coupled to the gap 160 and configured to receive a working gas. The plasma gun 100 also includes a plasma outlet 150 fluidly coupled to the gap 160 on the opposite side of the plasma gun 100 from the gas inlet 140 and configured to provide a path through which a plasma stream 180 can be expelled from the plasma gun 100.

During operation, working gas flows through the gas inlet 140, through the gap 160 and out of the outlet 150. At the same time, power is supplied to the plasma gun 100. The current arcing across the gap 160 energizes the working gas and forms plasma 180, which flows out of the outlet 150. Powdered material 110 is fed into the plasma stream 180 through a channel 170 that is fluidly coupled to the pathway between the gap 160 and the plasma outlet 150 via a port 175 to the pathway. The plasma stream 180 entrains and works on the powder, forming a plasma powder mixture that flows out of the plasma gun 100 through the outlet 150.

There is a problem with this configuration of the plasma gun. The radiant and conductive heat of the plasma 180 melts the powder particles 110 before they get all the way down the channel 170 and exit the port 175 into the pathway between the gap 160 and the outlet 150. As a result, the melted particles agglomerate and stick to the sides of the channel 170 and the port 175, clogging them up. Consequently, operation of the plasma gun has to be stopped until it is cleaned, which results in a significant loss of productivity.

SUMMARY OF THE INVENTION

In one aspect of the present invention, a method of using a plasma gun system is provided. The method comprises generating a plasma stream using a plasma gun, wherein the plasma stream flows through an outlet of the plasma gun and into an extension chamber having an interior diameter defined by a chamber wall. The plasma stream expands upon entering the extension chamber. A powder flows into the expanded plasma stream in the extension chamber via a port fluidly coupled to the extension chamber. The port introduces the powder to the expanded plasma stream at a location outside of the plasma gun.

In another aspect of the present invention, a plasma gun system is provided. The plasma gun system comprises a plasma gun and a plasma gun extension assembly. The plasma gun comprises an outlet and is configured to generate a plasma stream and provide the plasma stream to the outlet. The plasma gun extension assembly is configured to be coupled to the plasma gun. The plasma gun extension assembly comprises an extension chamber and a port. The extension chamber has an interior diameter defined by a chamber wall and is configured to receive the plasma stream from the outlet of the plasma gun and to enable the plasma stream to expand upon entering the extension chamber. The port is configured to introduce a powder to the expanded plasma stream at a location outside of the plasma gun.

In some embodiments, the port is disposed on a faceplate that is coupled between the plasma gun and the extension chamber. In some embodiments, the faceplate comprises a circular ring shape and the outlet of the plasma gun is aligned with the center of the faceplate to enable the plasma stream to pass the faceplate and flow into the extension chamber. In some embodiments, the faceplate comprises copper.

In some embodiments, the chamber wall comprises a ceramic material. In some embodiments, the chamber wall comprises boron nitride. In some embodiments, the chamber wall comprises a substantially tubular shape. In some embodiments, a stainless steel sheath is coupled to the faceplate and around the chamber wall.

In some embodiments, the faceplate is configured to be coupled to the chamber wall prior to being coupled to the plasma gun, thereby allowing the faceplate and the chamber wall to be coupled to the plasma gun and de-coupled from the plasma gun as a single unit. In some embodiments, the faceplate, the chamber wall, and the plasma gun are configured to be coupled together using one or more threaded fasteners.

DETAILED DESCRIPTION OF THE INVENTION

The following description is presented to enable one of ordinary skill in the art to make and use the invention and is provided in the context of a patent application and its requirements. Various modifications to the described embodiments will be readily apparent to those skilled in the art and the generic principles herein may be applied to other embodiments. Thus, the present invention is not intended to be limited to the embodiment shown but is to be accorded the widest scope consistent with the principles and features described herein.

This disclosure refers to both particles and powders. These two terms are equivalent, except for the caveat that a singular "powder" refers to a collection of particles. The present invention may apply to a wide variety of powders and particles. Powders that fall within the scope of the present invention may include, but are not limited to, any of the following: (a) nano-structured powders(nano-powders), having an average grain size less than 250 nanometers and an aspect ratio between one and one million; (b) submicron powders, having an average grain size less than 1 micron and an aspect ratio between one and one million; (c) ultra-fine powders, having an average grain size less than 100 microns and an aspect ratio between one and one million; and (d) fine powders, having an average grain size less than 500 microns and an aspect ratio between one and one million.

Figure 1:
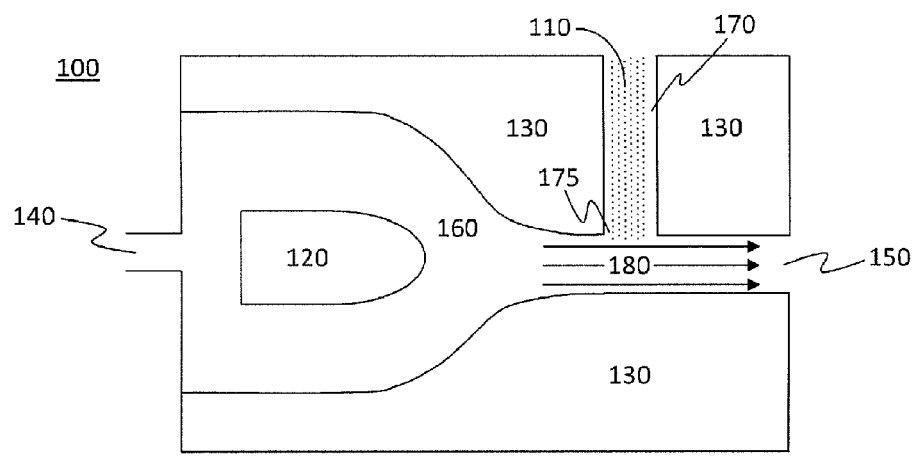
FIG. 1 illustrates one embodiment of a plasma gun used to process powder material.
Figure 2:
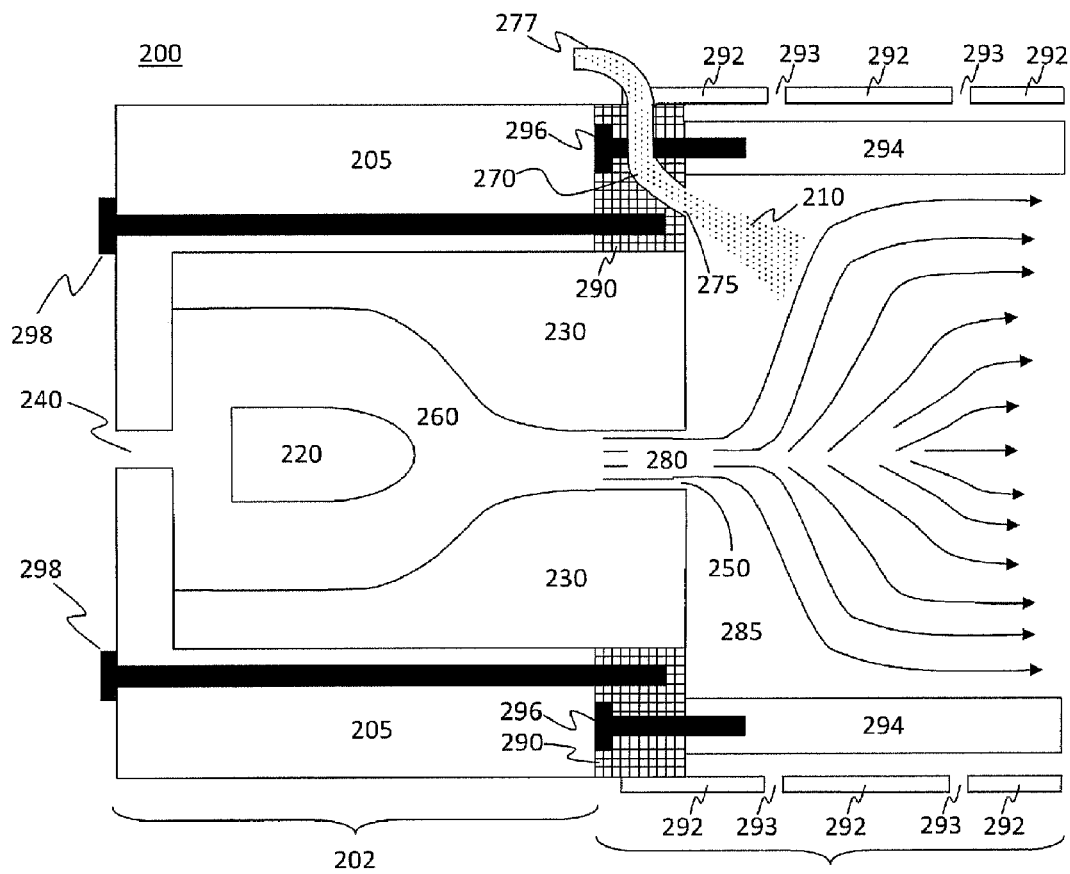
FIG. 2 illustrates one embodiment of a plasma gun and an extension assembly used to process powder material in accordance with the principles of the present invention.

FIG. 2 illustrates one embodiment of a plasma gun system 200 comprising a plasma gun 202 and an extension assembly 204. Generally, the plasma gun system 200 operates as a reactor, producing an output comprising particles within a gas stream.

In some embodiments, the plasma gun 202 includes a male electrode 220 and a female electrode 230 encased within an insulating housing 205. A power supply (not shown) is connected to the male electrode 220 and the female electrode 230 and delivers power through the plasma gun 202 by passing current across the gap 260 between the male electrode 220 and the female electrode 230. A variety of different means can be employed to deliver this energy, including, but not limited to, DC coupling, capacitive coupling, inductive coupling, and resonant coupling.

Furthermore, the plasma gun 202 includes a gas inlet 240 fluidly coupled to the gap 260 and configured to receive a working gas. The plasma gun 202 also includes a plasma outlet 250 fluidly coupled to the gap 260 on the opposite side of the plasma gun 202 from the gas inlet 240 and configured to provide a path through which a plasma stream 280 can be expelled from the plasma gun 202.

As the plasma stream 280 exits the plasma gun 202, it enters the extension chamber 285 of the extension assembly 204. The diameter of the extension chamber 285 is greater than the diameter of the pathway between the gap 260 and the plasma outlet 250. Therefore, the plasma stream 280 expands as it enters the extension chamber 285. A powder material 210 flows into the expanded plasma stream 280 in the extension chamber 285 via a port 275 that is fluidly coupled to the extension chamber 285. The port 275 introduces the powder 210 to the expanded plasma stream 280 at a location outside of the plasma gun 202.

In some embodiments, the extension assembly 204 comprises a faceplate 290 and an extension tube 294. It is noted that FIG. 2 displays faceplate 290 as a patterned component. However, the purpose of this patterning is to help distinguish the faceplate 290 from the other components and should not be used to limit the scope of the present invention.

In some embodiments, the port 275 is disposed on the faceplate 290, which is coupled between the plasma gun 202 and the extension chamber 285. In some embodiments, the faceplate 290 comprises a circular ring shape and the outlet 250 of the plasma gun 202 is aligned with the center of the faceplate 290 to enable the plasma stream 280 to pass the faceplate 290 and flow into the extension chamber 285. In some embodiments, the faceplate 290 is configured to fit securely around a protruding end portion of the plasma gun 202, such as the end of female electrode 230 as shown in FIG. 2. In some embodiments, the faceplate 290 is formed from a metal material. In some embodiments, the faceplate 290 comprises copper.

As previously discussed, the port 275 is configured to introduce the powder 210 to the expanded plasma stream 280 at a location outside of the plasma gun 202. In some embodiments, the port 275 is configured to enable the powder 210 to flow into the chamber 285, and into the plasma stream 280, at an angle that is configured in the general direction of the flow of the plasma stream 280 (i.e., away from the plasma gun 202). In some embodiments, the port 275 is configured to enable the powder 210 to flow into the chamber 285, and into the plasma stream 280, at an angle that is configured in the general direction of the flow of the plasma stream 280 (i.e., away from the plasma gun 202) and towards the center of the chamber 285. For example, in some embodiments, the port 275 is configured to enable the powder 210 to flow into the chamber 285, and into the plasma stream 280, towards the center of the chamber 285 at an angle approximately 45-degrees from the interior wall 294 of the chamber 285, as shown in FIG. 2.

In some embodiments, the powder material 210 is flows to the port 275 through a channel 270 that is fluidly coupled to the port 275. In some embodiments, the channel 270 is disposed within the faceplate 290. In some embodiments, the powder material 210 is supplied to the channel 270 via a feeding tube 277, which can be coupled to or formed integrally with the faceplate 290. In some embodiments, a valve (not shown) is disposed on the feeding tube 277 or on the faceplate 290 to control the flow of powder material through the channel 270 and port 275 and into the chamber 285.

In some embodiments, the extension chamber 285 has an interior diameter defined by the chamber wall 294. In some embodiments, the chamber wall 294 comprises a ceramic material. In some embodiments, the chamber wall 294 comprises boron nitride. In some embodiments, the chamber wall 294 comprises a substantially tubular shape.

In some embodiments, a stainless steel sheath 292 is coupled around the chamber wall 294. In cases where the stainless steel sheath 292 is used, it is preferably not in direct contact with the chamber wall 294 as such contact can cause overheating and melting of the sheath 292. Instead, the interior wall of the sheath 292 is preferably coupled to the faceplate 290, leaving an air gap between the chamber wall 294 and the sheath 292. In order to prevent the air gap from getting hot enough to melt the sheath 292, axial vents 293 can be disposed in the sheath 292 to allow the heat to escape from the air gap between the chamber wall 294 and the sheath 292. It is contemplated that the sheath 292 can be coupled around the chamber wall 294 in a variety of ways. In a preferred embodiment, the sheath 292 is coupled to the faceplate 290, thereby avoiding direct contact with the chamber wall 294. In some embodiments, the sheath 292 is coupled to the faceplate 290 using screws or some other fastening means (not shown). In some embodiments, ceramic screws (not shown) are used at or near the end of the chamber wall 294 opposite the faceplate 290 to support and center the chamber wall 294 within the sheath 292.

In some embodiments, the faceplate 290 is configured to be coupled to the chamber wall 294 prior to being coupled to the plasma gun 202, thereby allowing the faceplate 290 and the chamber wall 294 to be coupled to the plasma gun 202 and de-coupled from the plasma gun 202 as a single unit. In some embodiments, the faceplate 290, the chamber wall 294, and the plasma gun 202 are configured to be coupled together using one or more threaded fasteners. FIG. 2 shows the faceplate 290 being coupled to the chamber wall 294 using threaded fasteners 296. In a preferred embodiment, threaded fasteners 296 pass through the faceplate 290 at a location that does not interfere with channel 270. For example, in FIG. 2, the threaded fastener 296 at the top of the figure is shown being disposed behind channel 270. FIG. 2 also shows the coupling of the faceplate 290 and the chamber wall 294 being coupled to the plasma gun 202 using threaded fasteners 298. In this embodiment, the faceplate 290 and the chamber wall 294 can be de-coupled and removed from the plasma gun 202 as a single unit by loosening fasteners 298 if and when channel 270 and/or port 275 become clogged. A pre-coupled faceplate 290 and chamber wall 294 can then be immediately fastened to the plasma gun 202 using fasteners 298. By configuring the faceplate 290 and the chamber wall 294 to be coupled together separately from the plasma gun 202, the present invention significantly reduces and minimizes the amount of down time that occurs when a channel or port becomes clogged. A clean faceplate/chamber wall coupling can be immediately swapped in to replace the clogged faceplate/chamber wall coupling.

Figure 3:
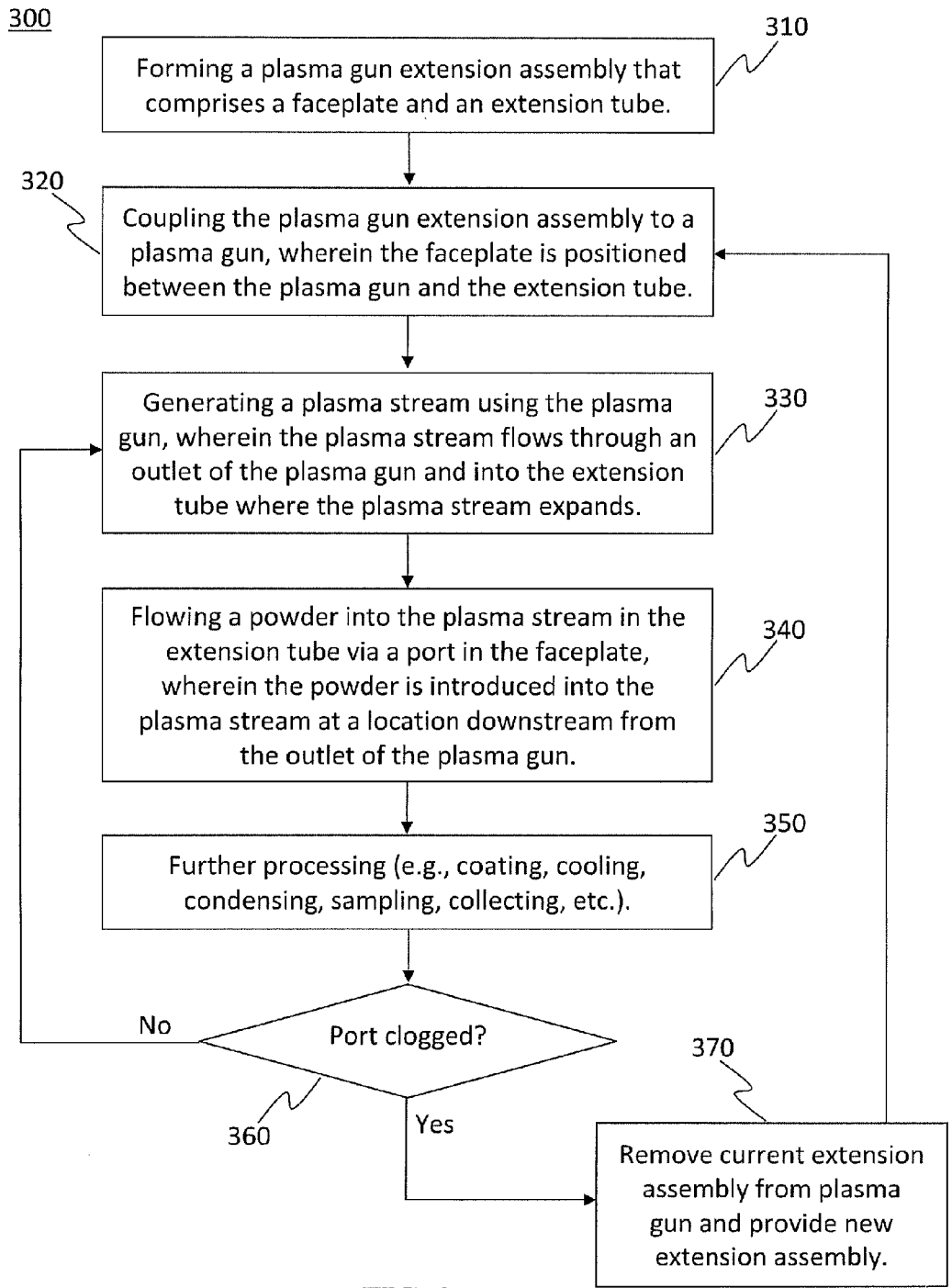
FIG. 3 illustrates one embodiment of method of using a plasma gun and an extension assembly to process powder material in accordance with the principles of the present invention.

FIG. 3 illustrates one embodiment of method 300 of using a plasma gun and an extension assembly to process powder material in accordance with the principles of the present invention.

At step 310, a plasma gun extension assembly is formed. In a preferred embodiment, the extension assembly comprises a faceplate and an extension tube coupled together, as discussed above with respect to FIG. 2.

At step 320, the extension assembly is coupled to a plasma gun, as discussed above with respect to FIG. 2. In a preferred embodiment, the faceplate of the extension assembly is positioned between the plasma gun and the extension tube as shown in FIG. 2. Furthermore, the extension assembly preferably comprises a port that is configured to introduce powder to an expanded plasma stream at a location outside of the plasma gun and within the extension assembly. In some embodiments, as discussed above, this port is disposed on the faceplate.

At step 330, a plasma stream is generated using the plasma gun. In a preferred embodiment, working gas flows through a gas inlet of the plasma gun, through a gap between an anode and a cathode, and out of an outlet of the plasma gun. At the same time, power is supplied to the plasma gun. The current arcing across the gap energizes the working gas and forms a the plasma stream, which flows out of the outlet and into the extension tube, where the plasma stream expands.

At step 340, a powder is flown into the plasma stream in the extension tube. In a preferred embodiment, the powder flows through a port in the faceplate and is introduced into the plasma stream at a location downstream from the outlet of the plasma gun. The plasma stream entrains and works on the powder, forming a highly reactive and energetic mixture, wherein the powder is vaporized in some embodiments.

At step 350, further processing of this mixture can be performed. For example, in some embodiments, this mixture of vaporized powder moves through the system in the flow direction of the working gas. As it moves, the mixture cools and condensed particles are formed therein. In some embodiments, particles of one type can be coated with particles of another type. In some embodiments, the reactive mixture flows into a quench portion of the extension assembly or a separate quench chamber. One example of a suitable quench chamber is provided in U.S. Provisional Patent Application Ser. No. 61/284,329, filed Dec. 15, 2009, and entitled "MATERIALS PROCESSING." The quench area preferably comprises a substantially cylindrical surface extending into a frusto-conical surface. The frusto-conical surface narrows to meet an outlet. The frusto-conical surface acts as a funneling surface, channeling conditioning fluid through into a quench region where the reactive mixture is to be conditioned. While the reactive mixture flows into the quench region, conditioning fluid is supplied into the quench region. Preferably, the angle at which the conditioning fluid is supplied produces a high degree of turbulence and promotes mixing with the reactive mixture. This turbulence can depend on many parameters. In a preferred embodiment, one or more of these parameters is adjustable to control the level of turbulence. These factors include the flow rates of the conditioning fluid, the temperature of the frusto-conical surface, the angle of the frusto-conical surface (which affects the angle at which the conditioning fluid is supplied into the quench region), and the size of the quench region. Following injection into the quench region, cooling, and particle formation, the mixture flows from the quench chamber through an outlet port. In some embodiments, suction generated by a generator moves the mixture and conditioning fluid from the quench region into a conduit. From the outlet port, the mixture flows along the conduit, toward the suction generator. Preferably, the particles are removed from the mixture by a collection or sampling system prior to encountering the suction generator.

At step 360, it is determined whether or not the port that introduces the powder into the extension chamber is clogged. If the port is not clogged, then the process continues to generate a plasma stream at step 330 and process powder. If the port is clogged, then the extension assembly is removed from the plasma gun, at step 370, and a new extension assembly is provided. The new extension assembly is then coupled to the plasma gun at step 320, and the process repeats the plasma generation and powder processing steps. Since the extension assembly, comprising the faceplate and the extension tube, is already pre-assembled, it takes very little time to replace the clogged extension assembly. The clogged extension assembly can simply be de-coupled from the plasma gun as a single unit, and the replacement extension assembly can then be coupled to the plasma gun as a single unit.

The present invention has been described in terms of specific embodiments incorporating details to facilitate the understanding of principles of construction and operation of the invention. Such reference herein to specific embodiments and details thereof is not intended to limit the scope of the claims appended hereto. It will be readily apparent to one skilled in the art that other various modifications may be made in the embodiment chosen for illustration without departing from the spirit and scope of the invention as defined by the claims.

What is claimed is:

1. A method of using a plasma gun system, the method comprising:
   generating a plasma stream using a plasma gun, wherein the plasma stream flows through an outlet of the plasma gun and into an extension chamber having an interior diameter defined by a chamber wall, the plasma stream expanding upon entering the extension chamber; and
   flowing a powder into the expanded plasma stream in the extension chamber through a channel fluidly coupled to a port that is fluidly coupled to the extension chamber, wherein the port introduces the powder to the expanded plasma stream at a location outside of the plasma gun and the port is disposed on a faceplate that is coupled to the plasma gun using one or more fasteners and to the chamber wall using one or more fasteners and the channel is disposed within the faceplate.

2. The method of claim 1, wherein the faceplate comprises a circular ring shape and the outlet of the plasma gun is aligned with the center of the faceplate to enable the plasma stream to pass the faceplate and flow into the extension chamber.

3. The method of claim 1, wherein the faceplate comprises copper.

4. The method of claim 1, wherein the chamber wall comprises a ceramic material.

5. The method of claim 4, wherein the chamber wall comprises boron nitride.

6. The method of claim 1, wherein the chamber wall comprises a substantially tubular shape.

7. The method of claim 1, wherein a stainless steel sheath is coupled to the faceplate and around the chamber wall.

8. The method of claim 1, wherein the faceplate is configured to be coupled to the chamber wall prior to being coupled to the plasma gun, thereby allowing the faceplate and the chamber wall to be coupled to the plasma gun and de-coupled from the plasma gun as a single unit.

9. The method of claim 8, wherein the faceplate, the chamber wall, and the plasma gun are configured to be coupled together using one or more threaded fasteners.

10. A plasma gun system comprising:
- a plasma gun comprising an outlet, wherein the plasma gun is configured to generate a plasma stream and provide the plasma stream to the outlet;
- a plasma gun extension assembly configured to be coupled to the plasma gun, wherein the plasma gun extension assembly comprises an extension chamber, the extension chamber having an interior diameter defined by a chamber wall and being configured to receive the plasma stream from the outlet of the plasma gun and to enable the plasma stream to expand upon entering the extension chamber; and
- a faceplate configured to be coupled to the plasma gun using one or more fasteners and to the chamber wall using one or more fasteners, wherein the face plate comprises a port disposed on the faceplate and a channel disposed within the faceplate that is fluidly coupled to the port, the port being configured to introduce a powder to the expanded plasma stream at a location outside of the plasma gun.

11. The system of claim 10, wherein the faceplate comprises a circular ring shape and the outlet of the plasma gun is aligned with the center of the faceplate to enable the plasma stream to pass the faceplate and flow into the extension chamber.

12. The system of claim 10, wherein the faceplate comprises copper.

13. The system of claim 10, wherein the chamber wall comprises a ceramic material.

14. The system of claim 10, wherein the chamber wall comprises boron nitride.

15. The system of claim 10, wherein the chamber wall comprises a substantially tubular shape.

16. The system of claim 10, wherein a stainless steel sheath is coupled to the faceplate and around the chamber wall.

17. The system of claim 10, wherein the faceplate is configured to be coupled to the chamber wall prior to being coupled to the plasma gun, thereby allowing the faceplate and the chamber wall to be coupled to the plasma gun and de-coupled from the plasma gun as a single unit.

18. The system of claim 17, wherein the faceplate, the chamber wall, and the plasma gun are configured to be coupled together using one or more threaded fasteners.

* * * * *